US006424175B1

(12) United States Patent
Vangal et al.

(10) Patent No.: US 6,424,175 B1
(45) Date of Patent: Jul. 23, 2002

(54) BIASED CONTROL LOOP CIRCUIT FOR SETTING IMPEDANCE OF OUTPUT DRIVER

(75) Inventors: Sriram R. Vangal, Hillsboro; Matthew B. Haycock; Stephen R. Mooney, both of Beaverton, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/659,499

(22) Filed: Sep. 11, 2000

(51) Int. Cl.[7] .............................................. H03K 17/16
(52) U.S. Cl. ............................. 326/82; 326/30; 326/90; 710/101; 710/126; 327/108
(58) Field of Search .............................. 326/30, 83, 86, 326/90; 710/101, 126; 327/108

(56) References Cited

U.S. PATENT DOCUMENTS

| | | | | |
|---|---|---|---|---|
| 5,481,207 A | * | 1/1996 | Crafts | 326/86 |
| 5,530,377 A | * | 6/1996 | Walls | 326/30 |
| 5,604,450 A | | 2/1997 | Borkar et al. | 326/82 |
| 6,087,847 A | | 7/2000 | Mooney et al. | 326/30 |
| 6,087,853 A | * | 7/2000 | Huber et al. | 326/83 |
| 6,118,310 A | * | 9/2000 | Esch, Jr. | 327/108 |
| 6,157,206 A | * | 12/2000 | Taylor et al. | 326/30 |

OTHER PUBLICATIONS

Comer, D.T., et al., "A CMOS Voltage to Current Converter for Low–Voltage Applications", This informtion is directly from Donald T. Comer's web site: http://www.ee.byu.edu/faculty/comerdt/publications.html, 13 p., (Feb. 11, 1997).

Filanovsky, I.M., "Voltage Reference Using Mutual Compensation of Mobility and Threshold Voltage Temperature Effects", ISCAS 2000—IEEE International Symposium on Circuits and Systems, pp. V197–V200, (May 2000).

Haycock, M., et al., "A 2.5Gb/s Bidrectional Signaling Technology", Hot Interconnects Symposium V, pp. 1–8, (Aug. 1997).

Lee, S., et al., "A Temperature and Supply–Voltage Insensitive CMOS Current Reference", IEICE Trans. Electron, vol. E82–C, pp. 1562–1566, (Aug. 1999).

* cited by examiner

*Primary Examiner*—Michael Tokar
*Assistant Examiner*—Vibol Tan
(74) *Attorney, Agent, or Firm*—Schwegman, Lundberg, Woessner & Kluth, P.A.

(57) ABSTRACT

A biased control loop for setting the impedance of an output driver includes a dummy driver having a variable output impedance, a sample and compare circuit to compare the output impedance of dummy output driver to a reference, and an up/down counter to modify the impedance. When the loop is locked, an error signal alternates positive and negative about a reference value. A digital filter produces a filtered version of the error signal with an apparent error value that does not alternate. The digital filter has a biased lock circuit that guarantees that the apparent error does not alternate. A simultaneous bidirectional port includes an output driver and the biased control loop to set the output driver impedance. When the output driver drives a bidirectional line and serves as a termination impedance for another driver, the reduced apparent error variation provides improved impedance matching.

30 Claims, 6 Drawing Sheets

BIASED CONTROL LOOP CIRCUIT FOR SETTING IMPEDANCE OF OUTPUT DRIVER

FIELD

The present invention relates generally to closed loop control systems, and more specifically to locking mechanisms within closed loop control systems.

BACKGROUND OF THE INVENTION

Control loop circuits typically use feedback to produce a signal that closely resembles a different signal external to the control loop circuit. Typical control loop circuits can also be made to produce a signal that closely resembles a mathematical function of another signal. For the purposes of this description, the signal produced by the control loop circuit is referred to as the "produced signal," and the signal that the control loop circuit attempts to replicate is referred to as the "external signal." Typical control loop circuits create an error signal that represents the difference between the external signal and the produced signal, and then attempt to minimize the error signal by varying the produced signal. As the external signal varies, the control loop circuit changes the produced signal. The loop is said to be "locked" when the error signal is reduced to an acceptable level. Typical control systems maintain a residual error value on the error signal when locked.

In typical control systems, the residual error value can be positive or negative depending on the movement of the external signal. For example, in a control loop that attempts to track the amplitude of the external signal, when the external signal increases in amplitude, the produced signal increases in amplitude in an attempt to follow the amplitude of the external signal. In this case, when the loop is locked, the residual error is negative because the produced signal is less than the external signal. Also for example, when the external signal decreases in amplitude, the residual error present after the loop has locked is positive because the amplitude of the produced signal is greater than the amplitude of the external signal.

The behavior described above creates a situation in which the error signal can vary by an amount equal to twice the maximum residual error. This is because at some lock points, the residual error is a maximum negative value, and at other lock points, the residual error is a maximum positive value. For the reasons stated above, and for other reasons stated below which will become apparent to those skilled in the art upon reading and understanding the present specification, there is a need in the art for a control loop mechanism that exhibits reduced residual error variations.

DESCRIPTION OF EMBODIMENTS

Figure 1:
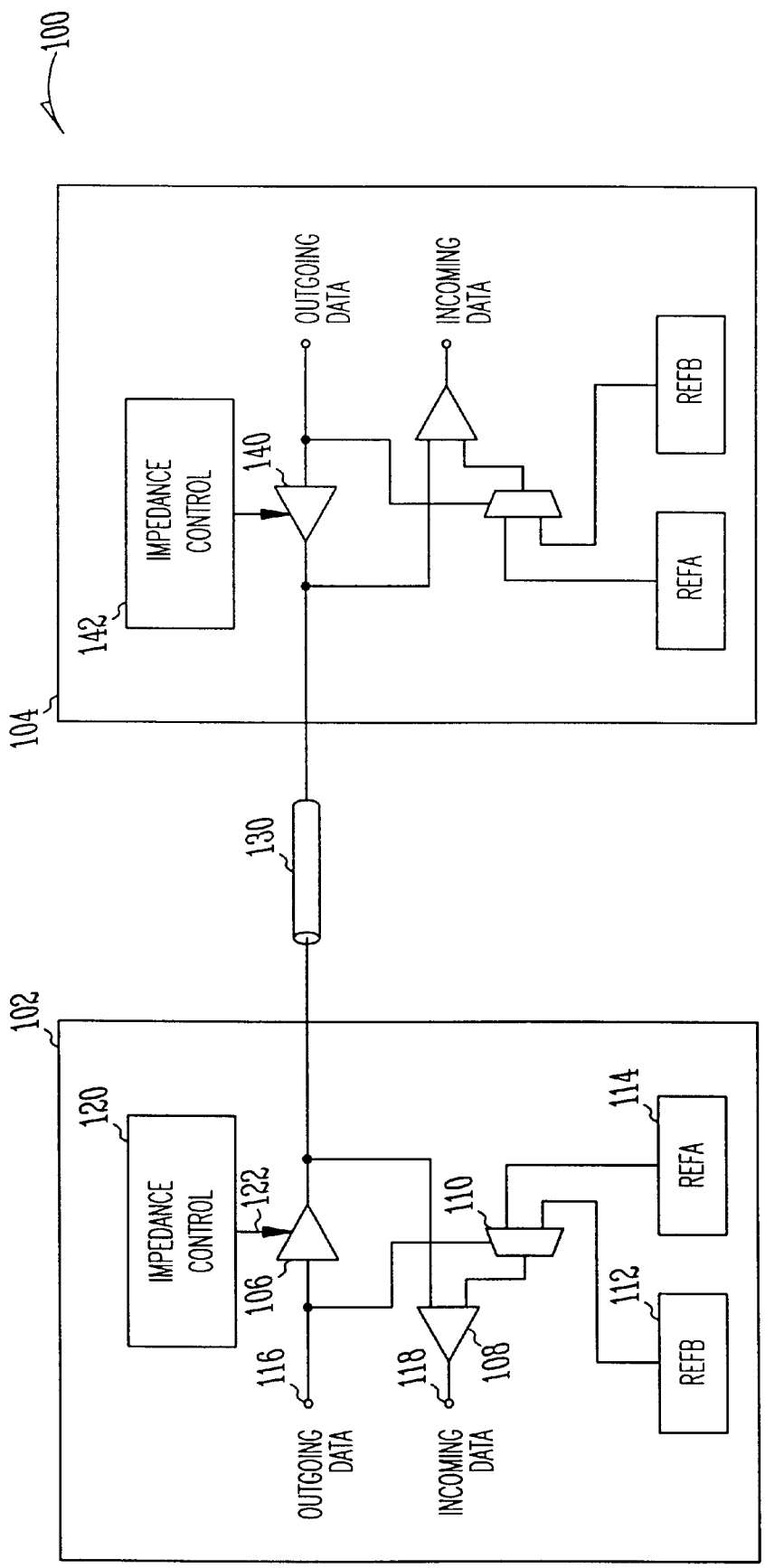
FIG. 1 shows a system employing simultaneous bidirectional data ports.

In the following detailed description of the embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

The method and apparatus of the present invention provide a mechanism to bias the locking behavior of a control loop circuit to reduce the apparent maximum residual error variation. In one embodiment, the control loop circuit is implemented in a closed loop impedance control circuit that produces a signal to control the impedance of an output driver. The apparent residual error variation in the control loop circuit is reduced by a digital filter that can detect a lock condition, and can produce a filtered signal that is biased as if the loop always locks to one side.

FIG. 1 shows a system employing simultaneous bidirectional data ports. System 100 includes transceivers 102 and 104, and bidirectional data line 130. Transceiver 102 includes driver 106, receiver 108, reference circuits 112 and 114, and impedance control circuit 120. Driver 106 drives outbound data onto bidirectional data line 130. Bidirectional data line 130 also has data driven thereon by driver 140 within transceiver 104. Receiver 108 receives the combined signal on bidirectional data line 130 and also receives a reference signal through multiplexer 110 from one of reference circuits 112 and 114.

The reference voltage is selected by multiplexer 110 as a function of the outbound data driven onto bidirectional data line 130 by driver 106. Receiver 108 compares the selected reference voltage value to the voltage value on bidirectional data line 130. In this manner, receiver 108 can remove an ambiguity caused by the combination of the outbound data and inbound data on bidirectional data line 130. For example, if outbound data driven by driver 106 is near the positive voltage rail, and the inbound data driven by transceiver 104 is near the negative voltage rail, the voltage value present on bidirectional data line 130 is approximately halfway between the positive and negative voltage rails. Likewise, if outbound data is near the negative voltage rail, and inbound data is near the positive voltage rail, the voltage value present on bidirectional data line 130 is also approximately halfway between the positive and negative voltage rails. An ambiguity arises because the voltage value present on bidirectional data line 130 is substantially the same in both scenarios just described.

The state of the outbound data is used to select which reference voltage value is used by receiver 108, and the ambiguity can be removed as a result. For example, when the reference voltage is approximately equal to 75 percent of the positive voltage rail and the voltage on bidirectional data line 130 is approximately halfway between the positive and negative voltage rails, the inbound data is detected as a zero. Likewise, when the reference voltage is approximately equal to 25 percent of the negative voltage rail and the voltage on bidirectional data line 130 is approximately halfway between the positive and negative voltage rails, the inbound data is detected as a one.

As previously described, driver 106 in transceiver 102 and driver 140 in transceiver 104 both simultaneously drive bidirectional data line 130. In the embodiment shown in FIG. 1, each of drivers 106 and 140 provide a terminating impedance for the other. For example, when driver 106 drives bidirectional data line 130, the output impedance of driver 140 serves as a terminating impedance for driver 106 and bidirectional data line 130. Likewise, when driver 140 drives bidirectional data line 130, the output impedance of driver 106 serves as a terminating impedance for driver 140 and bidirectional data line 130.

Impedance control circuit 120 adjusts the output impedance of driver 106, and impedance control circuit 142 adjusts the output impedance of driver 140. Impedances are matched when the output impedance of both drivers 106 and 140 match the characteristic impedance of bidirectional data line 130. Impedance control circuits 120 and 142 implement a closed loop control circuit to adjust the impedance of drivers 106 and 140 in an attempt to provide matched impedances, thereby providing for reliable communications.

By matching the impedance, reflections of electrical signals traveling from one driver through bidirectional line 130 to another driver are limited. System 100 may be employed as a signal bus between a microprocessor and associated peripherals, a memory and a memory controller, or between any other combination of integrated circuits. For example, transceivers 102 and 104 can be implemented within processors, processor peripherals, memory devices including dynamic random access memories (DRAM), memory controllers, or any other integrated circuit employing simultaneous bidirectional ports.

The simultaneous bidirectional data ports shown in FIG. 1 are but one type of simultaneous bidirectional data port. Details of one embodiment of a simultaneous bidirectional data port can be found in U.S. Pat. No. 5,604,450, issued Feb. 18, 1997.

Figure 2:
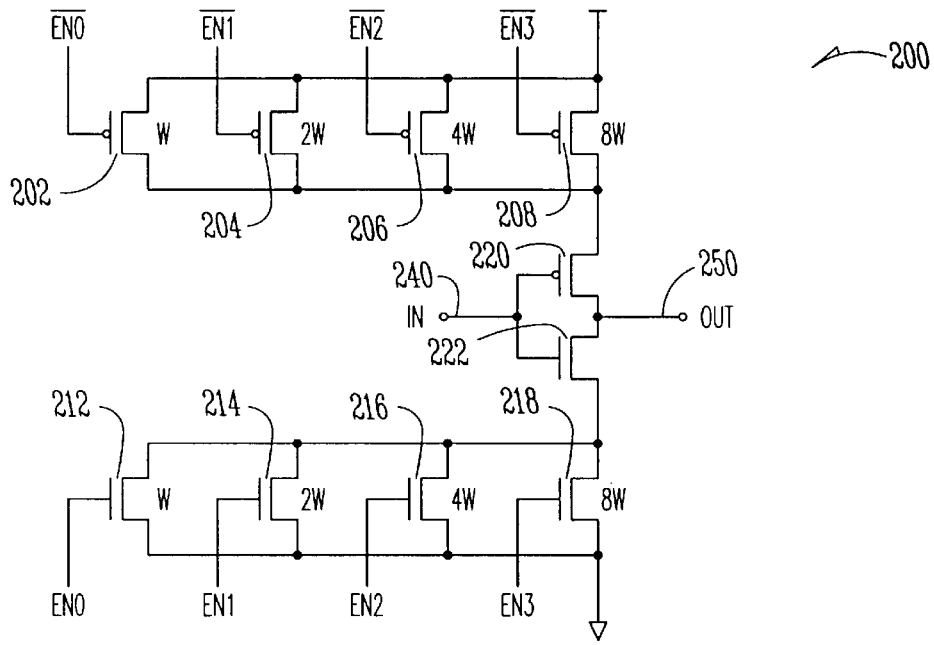
FIG. 2 shows a variable output impedance driver.

FIG. 2 shows a variable output impedance driver. Driver 200 is a driver, such as driver 106, capable of driving a bidirectional data line. The enable signals (EN0–EN3) correspond to the impedance control value on node 122 (FIG. 1).

Driver 200 includes input node 240 and output node 250. Input node 240 is coupled to the gate of P-channel metal oxide semiconductor (PMOS) transistor 220, and is also coupled to the gate of N-channel metal oxide semiconductor (NMOS) transistor 222. Taken together, PMOS transistor 220 and NMOS transistor 222 function as an inverter. Connected in a cascode arrangement with PMOS transistor 220 are parallel PMOS transistors 202, 204, 206, and 208. Likewise, connected in a cascode arrangement with NMOS transistor 222 are parallel NMOS transistors 212, 214, 216, and 218. Any number of parallel PMOS transistors and parallel NMOS transistors can be on at any time, thereby providing a variable output impedance at node 250. The parallel NMOS and PMOS transistors are sized with a binary weighting such that the output impedance can be controlled with a binary number. For example, PMOS transistor 202 and NMOS transistor 212 have a size of "W," PMOS transistor 204 and NMOS transistor 214 have a size twice as great, and so on. The binary number in the embodiment of FIG. 2 is four bits wide corresponding to the enable signals labeled EN0 through EN3.

The use of a binary weighted impedance control mechanism allows up/down counter to be employed to modify the impedance one value at a time. As the control signals from the up/down counter count up, more (or larger) transistors are turned on, and the output impedance drops. Likewise, as the counter counts down, the output impedance increases.

In another embodiment, linear weighting is employed. Linear weighting allows a shift register or other similar component to control the output impedance by changing one bit at a time. A driver having linear weighted impedance control allows for precise control of the output impedance with reduced chance of glitches at the expense of increased signal lines and transistor count. For example, in the embodiment of FIG. 2, four enable signals provide 16 different output impedance values. A linear weighted output driver with 16 impedance values includes 16parallel NMOS transistors and 16 parallel PMOS transistors driven by 16 control signals. Linear weighted drivers can be implemented without departing from the scope of the present invention.

Figure 3:
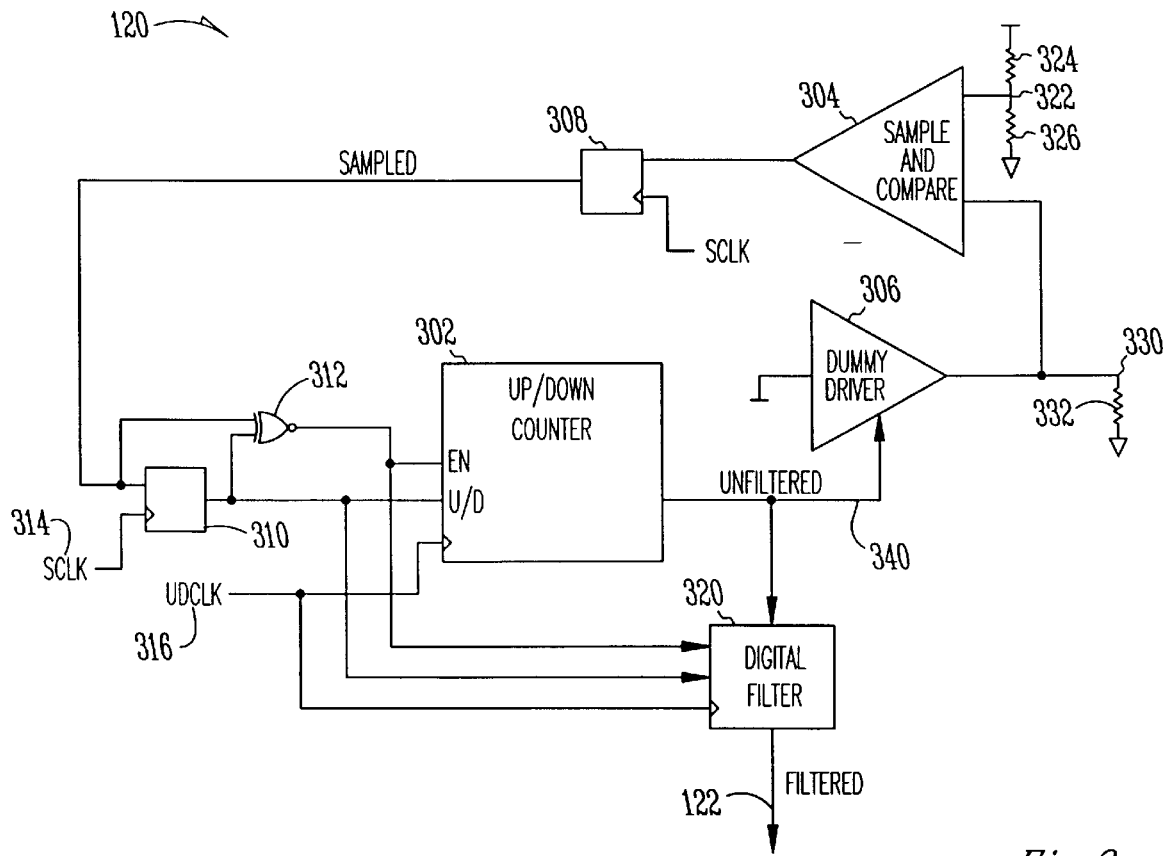
FIG. 3 shows a closed loop impedance control circuit.

FIG. 3 shows a closed loop impedance control circuit. Closed loop impedance control circuit 120 includes sample and compare circuit 304, flip-flops 308 and 310, gate 312, up/down counter 302, dummy driver 306, and digital filter 320. The control loop is formed by sample and compare circuit 304, flip-flops 308 and 310, gate 312, up/down counter 302, and dummy driver 306. In some embodiments, dummy driver 306 is a driver substantially the same as driver 200 (FIG. 2), and is terminated with resistor 330. In some embodiments, resistor 330 is a precision resistor external to the integrated circuit that includes closed loop impedance control circuit 120. This allows a system designer to select a value for resistor 332, thereby selecting reference voltage 330. In some embodiments, the voltage divider that includes resistors 324 and 326 is an on-chip reference.

The voltage on node 330, which is a function of the output impedance of dummy driver 306, is compared with a target voltage on node 322 by sample and compare circuit 304. In some embodiments, sample and compare circuit 304 is an analog comparator that samples the voltage values on nodes 322 and 330, compares them, and produces a digital signal on the output to signify which of the two input voltage values is larger. The output of sample and compare circuit 304 is synchronized to a sample clock by flip-flops 308 and 310, and the resulting signal controls the counting of up/down counter 302. Up/down counter 302 produces an unfiltered impedance control value on node 340, which controls the output impedance of dummy driver 306, and closes the loop. When the impedance of dummy driver 306 needs to be decreased, up/down counter 302 counts up, and the unfiltered impedance control value on node 340 counts up. Likewise, when the impedance of dummy driver 306 needs to increase, up/down counter 302 decreases and the unfiltered impedance control value on node 340 also decreases.

When the control loop of impedance control circuit 120 locks, the unfiltered impedance control signal on node 340 alternates between two values. This results from the fact that the change in output impedance of dummy driver 306 causes the voltage on node 330 to surpass the voltage on node 322. In one embodiment, for each successive clock cycle thereafter, the unfiltered impedance control signal on node 340 alternates counting up and down as the voltage on node 330 alternates higher and lower than the target voltage on node 322.

Impedance control circuit 120 also includes digital filter 320. Digital filter 320 receives the unfiltered impedance control value on node 340 and produces a filtered impedance control value on node 122. Referring now back to FIG. 1, the filtered impedance control value on node 122 controls the output impedance of driver 106. When the loop is locked and the unfiltered impedance control signal alternates between two values, digital filter 320 provides a steady state filtered impedance control signal to driver 106 on node 122.

For the purposes of this description, the two sides of the target impedance value are described as the "strong side" and the "weak side." The strong side is the side of lower impedance, and the weak side is the side of higher impedance. When the loop locks on the strong side, the driver controlled by the filtered impedance control value has a slightly lower impedance than if it had locked on the weak side. The term "strong" is used to describe the ability of the driver to sink more current by virtue of the reduced impedance. As more fully described below, the loop is biased to always lock with the filtered impedance control value on the strong side. When two drivers drive a single bidirectional line such as bidirectional line 130 (FIG. 1), having both drivers lock on the same side of the target provides a better impedance match than if one driver locked on one side while the other driver locked on the other side.

In the embodiment of FIG. 3, when the unfiltered impedance control value increases, the output impedance of dummy driver 306 decreases. Also, when the unfiltered impedance control value decreases, the output impedance of dummy driver 306 increases. In a like manner, when the filtered impedance control value increases, the output impedance of the driver being controlled decreases, and when the filtered impedance control value decreases, the output impedance increases.

Figure 4:
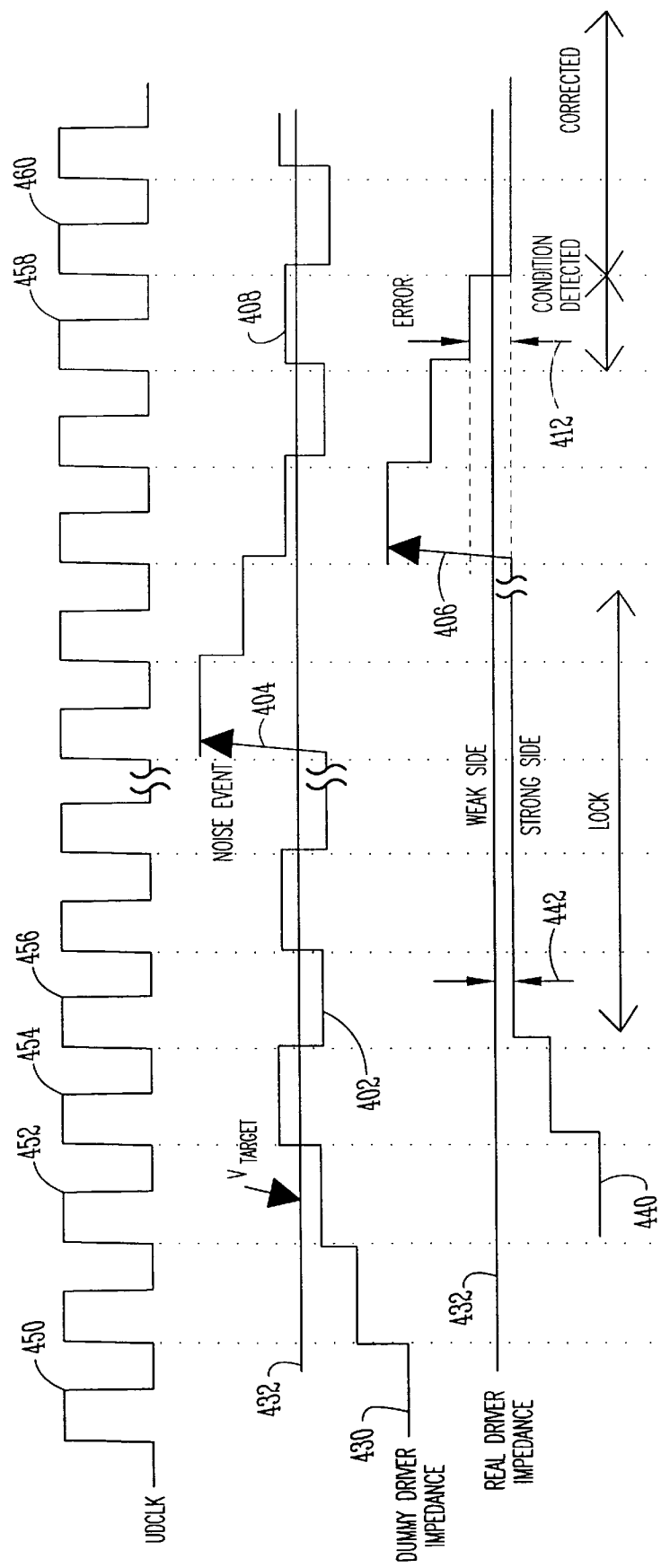
FIG. 4 shows a diagram of a lock sequence.

FIG. 4 shows a diagram of a lock sequence of the impedance control circuit of FIG. 3. Trace 430 describes the behavior of the voltage on node 330 in FIG. 3, and reference 432 represents the target voltage present on node 322. Viewed differently, trace 430 also represents the output impedance of dummy driver 306, and reference 432 represents the desired impedance value. The remainder of this description refers to trace 430 as the dummy driver impedance value. In contrast to the dummy driver impedance value, trace 440 represents the "real driver" impedance value as controlled by the filtered impedance control value generated by digital filter 320. The real driver impedance value is used to control the impedance of a driver used in a real communications circuit rather than in a control loop. For example, driver 106 is a real driver used in a communications circuit.

During clock period 450, the dummy driver output impedance of trace 430 is shown below reference 432. During subsequent periods of clock signal UDCLK, the impedance shown by trace 430 increases because the up/down counter counts down. During clock period 452 trace 430 is below reference 432, and the impedance increases by one least significant bit (LSB) of the counter on the next clock cycle. At this point, trace 430 crosses reference 432, and is shown above reference 412 during clock period 454. The steady-state condition is reached when the dummy driver output impedance shown by trace 430 alternates above and below reference 432. The residual error alternates positive and negative as trace 430 alternates above and below reference 432. At this point, the loop is locked.

Trace 440, which represents the real driver output impedance, is shown increasing in value prior to the time at which the loop locks. Trace 440 follows the action of trace 430 and increases in value prior to the loop locking. During clock period 456, trace 440 is locked with an apparent residual error value shown as error 442. The actual error value alternates positive and negative as the unfiltered value alternates about the reference. The filtered output does not alternate, and provides the apparent residual error value as shown.

Prior to a locked condition existing, the output of digital filter 320 (FIG. 3) follows the output of up/down counter 302. That is to say, as the unfiltered impedance control value monotonically increases or decreases, the filtered impedance value also monotonically increases or decreases. After the loop is locked, however, the unfiltered impedance control value alternates between two values, and the filtered impedance control value remains constant. As shown in FIG. 4, trace 440 increases for as long as trace 430 increases. When trace 430 alternates between two values about the reference 432, trace 440 remains constant with apparent residual error value 442.

Event 404 is a noise event that causes the voltage on node 330 (which is the output node of dummy driver 306) to change. When trace 430 moves above reference 432 due to such a noise event, the loop is no longer locked. This is shown at discontinuity 406 where trace 440 is above reference 432. As trace 430 decreases monotonically, trace 440 also decreases monotonically. The loop locks once again during clock period 458 when trace 430 begins to alternate about reference 432. Rather than allow the output of digital filter 320 to lock above the reference, the method and apparatus of the present invention detect that the loop is locked and that the real driver impedance is on the weak side and corrects this condition by latching the output of the counter to present the filtered impedance control value such that the output impedance of the driver can be locked on the strong side rather than the weak side.

The method and apparatus of the present invention provide a biased lock condition where the filtered output is biased to one side. As shown in FIG. 4, regardless of the direction from which the filtered output approaches the reference, during the locked condition, the filtered output is below the reference. As a result, each driver having an impedance controlled by the filtered impedance control value has a slightly lower impedance than if the lock condition were allowed to exist with the filtered output above the reference. When multiple drivers drive a single bus, such as drivers 106 and 140 (FIG. 1), the method and apparatus of the present invention can operate to provide a more balanced impedance termination for each driver. For example, if one integrated circuit experiences a noise event, such as event 404, that the other integrated circuit does not experience, once the loop circuit reaches steady-state, both drivers provide a termination impedance to the other with an impedance value generated from the filtered output below the reference.

If the filtered output were allowed to remain above the reference, one driver on a bus could have an impedance above the reference, and another driver could have an impedance below the reference. This is shown at 412 during clock period 458. An impedance mismatch can be created by this condition, as great as two least significant bits (LSB) of the counter. The method and apparatus of the present invention detects this condition, and latches the output to reduce the apparent residual error to a value shown by residual error 442.

Figure 5:
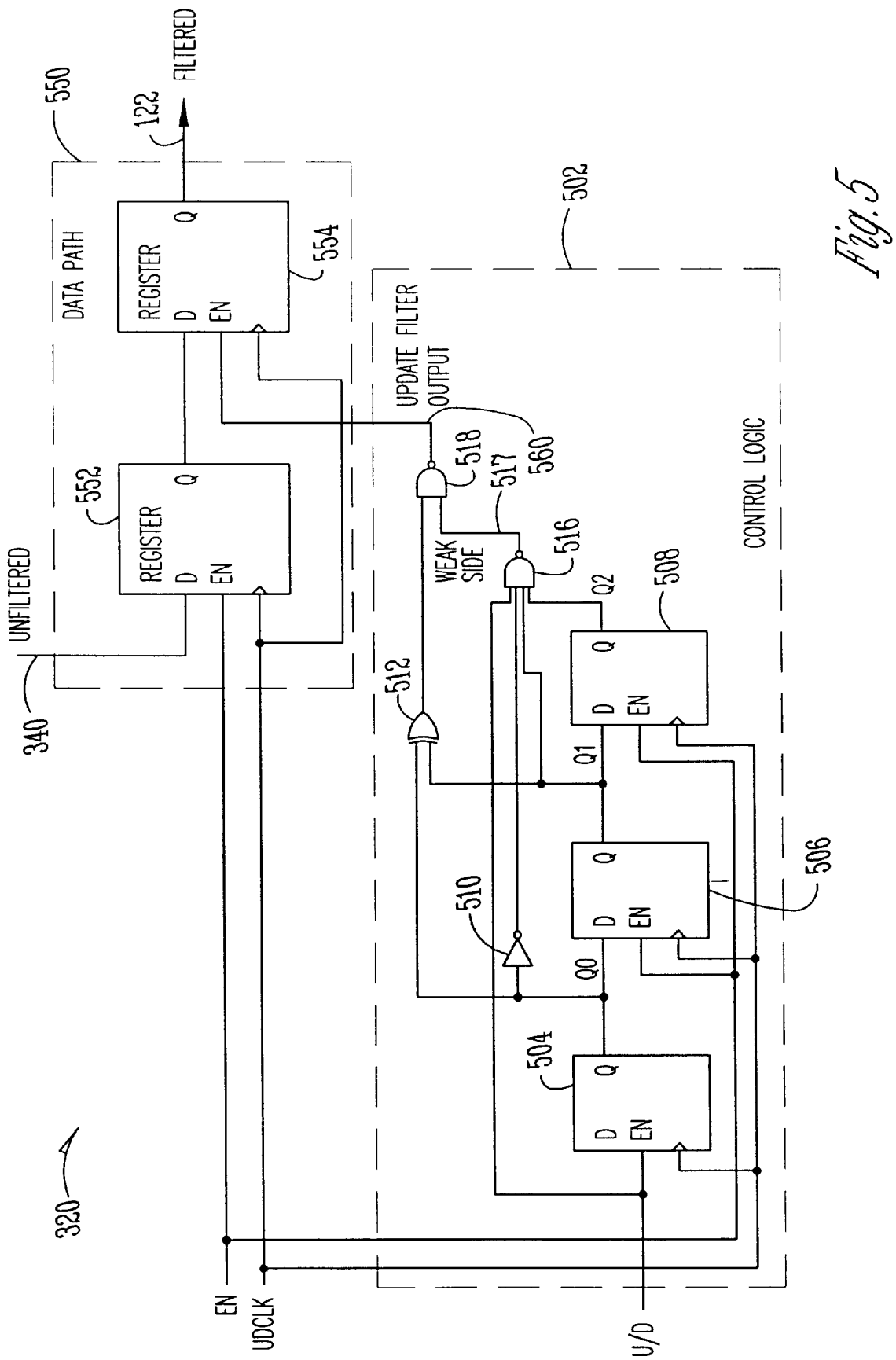
FIG. 5 shows a digital filter.

FIG. 5 shows a digital filter. Digital filter 320 includes data path 550 and control logic 502. Data path 550 includes registers 552 and 554. Register 552 receives the unfiltered impedance control value on node 340 and stores it at the frequency of UDCLK. Register 554 receives the output of register 552 and stores it whenever control logic 502 asserts the update filter output signal on node 560.

Control logic 502 asserts the update filter output signal on node 560 whenever the filtered output on node 122 is to be updated. The filtered output is updated whenever the unfiltered output is changing monotonically, or when the unfiltered output is alternating and the locked condition was approached from the weak side. For example, referring now back to FIG. 4, trace 440 is shown increasing as trace 430 is increasing. This corresponds to filter output 122 being updated as the dummy driver output impedance value increases monotonically. The filtered output is no longer updated once the unfiltered value reaches a locked condition and alternates about the reference. In this case, the filtered output locks on the side of the reference from which it approached. When the dummy driver output impedance value approaches the reference from above, the filtered output is updated and follows the unfiltered output as it crosses to the strong side of the reference. Rather than reaching a steady-state on the weak side of the reference (the direction from which it approached), the filtered output is updated one additional time to set the locked condition such that the filtered output locks on the opposite side of the reference (the strong side).

Control logic 502 accomplishes this behavior. Flip flops 504, 506, and 508 store past values of the up/down signal. Gate 512 detects the lock condition and updates register 554 whenever the unfiltered impedance value is increasing or decreasing monotonically. Gate 516 detects the condition shown at 412 in FIG. 4 and causes the update filter output signal on node 560 to be asserted one additional time, and updates the filtered impedance control value on node 122. The output of gate 516 is termed the "weak side" signal because it detects that the lock has occurred from the weak side.

In the specific embodiment shown and described, the bias locking mechanism is implemented in a closed loop impedance control system for a simultaneous bidirectional data port. The biased lock detect and correct mechanism of the present invention can be utilized in any closed loop system to reduce apparent residual error variation during the period in which the loop is locked.

Figure 6:
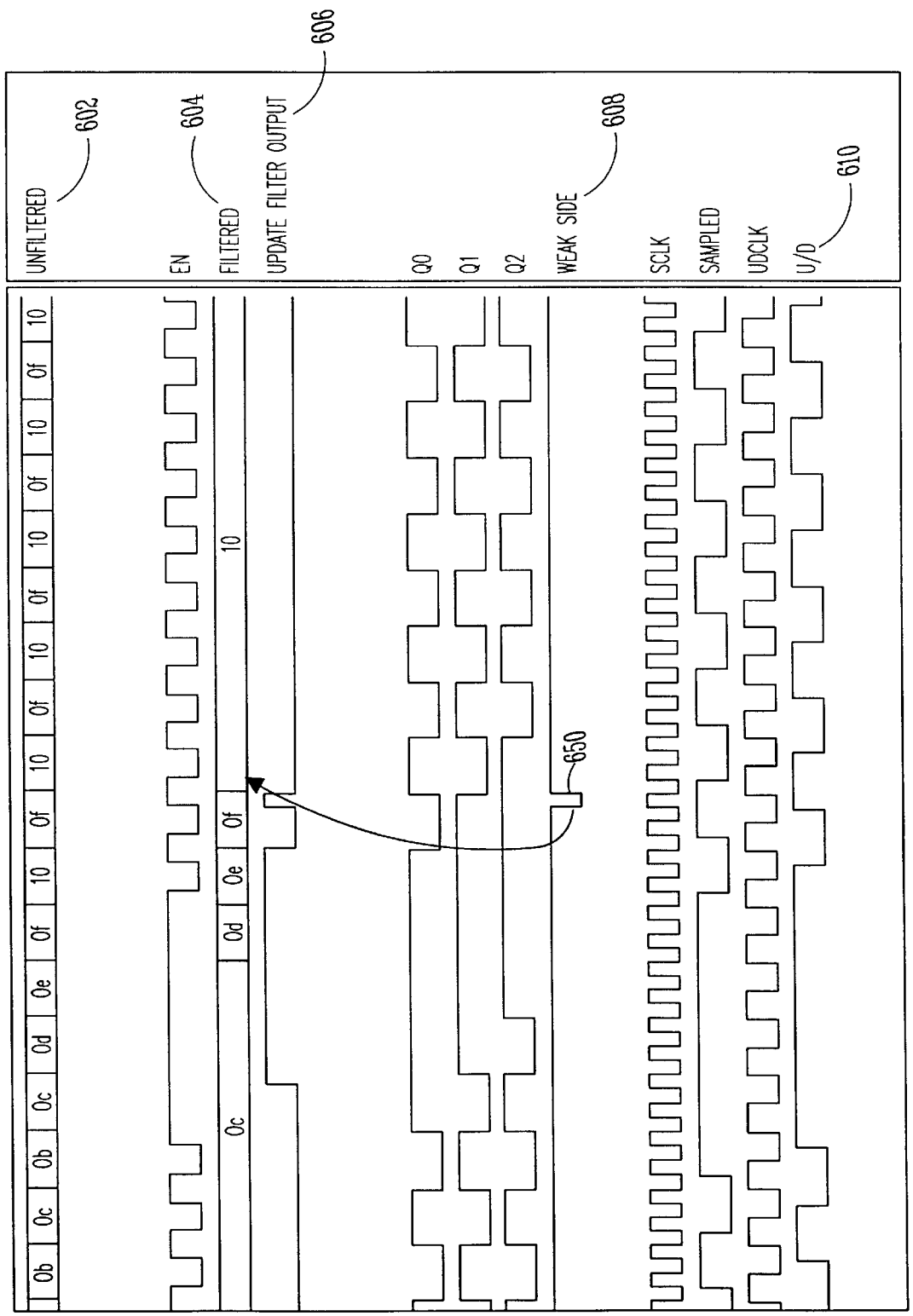
FIG. 6 shows a simulation trace.

FIG. 6 shows a simulation trace. As shown in FIG. 6, a higher impedance control value provides a lower impedance. Trace 602 shows the unfiltered impedance control value corresponding to the data on node 340 (FIG. 3), and trace 604 shows a filtered impedance control value corresponding to the data present on node 122 output from digital filter 320 (FIG. 3). The update filter output signal generated by control logic 502 (FIG. 5) is shown by trace 606. The weak side signal generated by gate 516 (FIG. 5) is shown by trace 608.

The simulation trace begins with the loop locked. The unfiltered impedance value alternates between hexadecimal values of B and C, and the filtered impedance value is locked with a value of C. The up/down signal shown by trace 610 is asserted to indicate that an impedance change is to take place. The unfiltered impedance control value begins to increase monotonically and then lock, alternating between values of hexadecimal F and 10. Rather than allow the filtered output to remain with the value of F, the weak side signal is asserted as shown at 650, thereby causing the filtered output to be updated one more time to the strong side. This results in the value of 10 as shown by trace 604.

Figure 7:
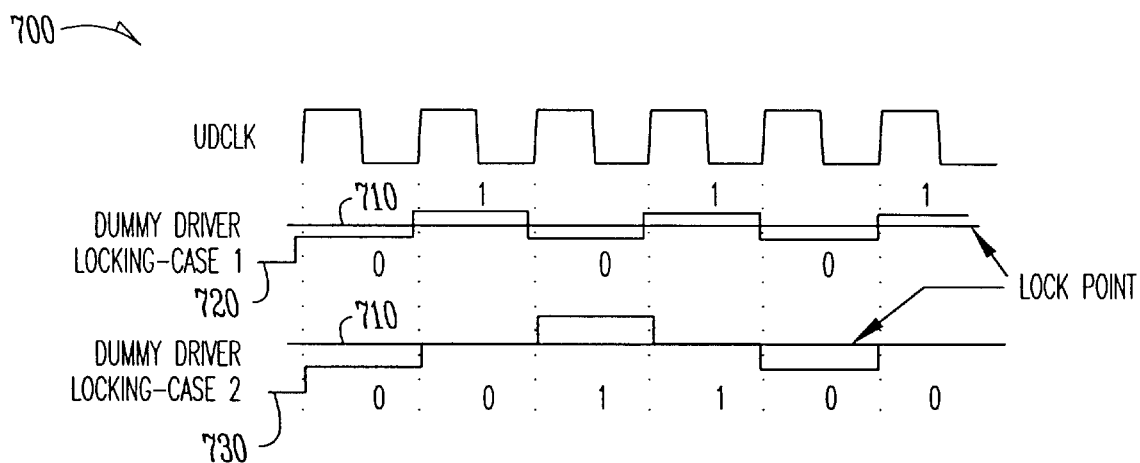
FIG. 7 shows a diagram of two lock patterns.

FIG. 7 shows a diagram of two lock patterns. FIG. 7 shows that the method and apparatus of the present invention allows for alternating values as shown by trace 720, and also allows for a lock condition that alternates with twice the period. For example, as shown by trace 720, the up/down signal can alternate every clock period and produce a sequence of 0101. Also for example, as shown by trace 730, the up/down signal can alternate every other clock period to produce a sequence corresponding to 00110011.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A circuit to create a filtered impedance control value comprising:

a dummy driver having an impedance control input node to receive an unfiltered impedance control value;

a first circuit to compare an output impedance of the dummy driver to a reference value;

a counter to change the unfiltered impedance control value responsive to the first circuit; and a digital filter to create the filtered impedance control value from the unfiltered impedance control value, the digital filter being configured to set the filtered impedance control value to a steady state value biased to one side of the reference value.

2. The circuit of claim 1 further comprising a reference circuit to produce the reference value.

3. The circuit of claim 2 wherein the reference circuit comprises a resistive divider.

4. The circuit of claim 1 wherein:

the first circuit produces an error signal to which the counter is responsive; and the digital filter is configured to set the filtered impedance control value to the steady state when the error signal comprises an alternating pattern.

5. The circuit of claim 4 wherein the alternating pattern comprises 0101.

6. The circuit of claim 4 wherein the alternating pattern comprises 00110011.

7. The circuit of claim 1 wherein the dummy driver includes binary weighted impedance components.

8. A control loop circuit comprising:

a reference device to produce a reference value on an output node;

a sampling and comparison circuit to compare the reference value and a first output value of the control loop circuit to create an error signal;

a counter to receive the error signal and to move the first output value of the control loop circuit towards the reference value; and a digital filter to conditionally change a second output value of the control loop circuit such that the second output value of the control loop circuit always locks to one side of the reference value, the digital filter being responsive to the error signal and the first output value of the control loop circuit.

9. The control loop circuit of claim 8 wherein the digital filter comprises:

an input node to accept the error signal; and a first circuit to lock the second output value of the control loop when the error signal alternates between two values.

10. The control loop circuit of claim 9 wherein the first circuit is configured to lock the second output value of the control loop when the error signal on the input node comprises a pattern of 0101.

11. The control loop circuit of claim 9 wherein the first circuit is configured to lock the second output value of the control loop when the error signal on the input node comprises a pattern of 00110011.

12. The control loop circuit of claim 9 wherein the digital filter further comprises:
   a second input node to accept the first output value of the control loop circuit; and
   a second circuit to detect a lock condition of the first circuit, and to modify the lock condition such that the second output value locks to one side of the reference value.

13. The control loop circuit of claim 12 further comprising a driver circuit to modify an impedance of a transmission line responsive to the first output value.

14. The control loop circuit of claim 13 wherein the reference device comprises a resistive divider, and the sampling and comparison circuit is responsive to a first voltage on the resistive divider and to a second voltage on the transmission line.

15. A digital filter to smooth a digital input signal comprising:
   a comparison circuit to compare a plurality of previous input samples, and to change an output value if the plurality of previous input samples monotonically change, and to lock the output value if the plurality of previous input samples do not monotonically change; and
   a biased-lock detect circuit to detect a current lock condition, and to compare the current lock condition against a preferred lock condition, and to conditionally change the current lock condition to the preferred lock condition.

16. The digital filter of claim 15 further comprising:
   a counter to generate the input samples responsive to an error signal, wherein the comparison circuit is configured to compare the plurality of previous input samples by comparing previous values of the error signal.

17. The digital filter of claim 16 wherein the current lock condition occurs when the error signal comprises a sequence corresponding to 0101.

18. The digital filter of claim 16 wherein the current lock condition occurs when the error signal comprises a sequence corresponding to 00110011.

19. The digital filter of claim 15 wherein the current lock condition occurs when a digital output value alternates between two values.

20. The digital filter of claim 15 wherein the preferred lock condition indicates a lock on a preferred side of a reference value.

21. An integrated circuit comprising:
   a bidirectional port having a driver and a receiver to be coupled to a single transmission line, the driver having a programmable output impedance value; and
   a control loop circuit to set the programmable output impedance value, the control loop circuit comprising a digital filter configured to lock the programmable output impedance value on one side of a reference value.

22. The integrated circuit of claim 21 wherein the control loop circuit further comprises:
   a counter to create an unfiltered impedance control value responsive to an error signal;
   a dummy driver having a dummy driver impedance value controlled by the unfiltered impedance control value; and
   a comparator to compare the dummy driver impedance value and the unfiltered impedance control value, and to create the error signal.

23. The integrated circuit of claim 22 wherein the driver comprises binary weighted impedance components.

24. The integrated circuit of claim 22 further including a reference circuit to generate the reference value.

25. The integrated circuit of claim 22 wherein the digital filter is configured to lock the programmable impedance value when the error signal alternates between two values.

26. The integrated circuit of claim 22 further including a plurality of drivers having a plurality of programmable output impedance values, the control loop circuit being configured to set the plurality of programmable output impedance values.

27. An electronic system comprising:
   a first integrated circuit including a first bidirectional port with a first driver and a first receiver to be coupled to a transmission line, the first driver having a first programmable output impedance value, and further including a first control loop circuit to set the first programmable output impedance value; and
   a second integrated circuit including a second bidirectional port with a second driver and a second receiver to be coupled to the transmission line, the second driver having a second programmable output impedance value, and further including a second control loop circuit to set the second programmable output impedance value;
   wherein the first and second control loop circuits each comprise a digital filter configured to lock the first and second programmable output impedance values on one side of a reference value.

28. The electronic system of claim 27 wherein the first control loop circuit comprises:
   a dummy driver having a dummy driver impedance value; and
   a comparator to compare the dummy driver impedance value and the reference value.

29. The electronic system of claim 28 wherein the first control loop circuit further comprises a counter to change an unfiltered impedance control value responsive to the comparator.

30. The electronic system of claim 29 wherein the first control loop circuit further comprises a digital filter to create the first programmable output impedance value from the unfiltered impedance control value.

* * * * *

UNITED STATES PATENT AND TRADEMARK OFFICE
CERTIFICATE OF CORRECTION

PATENT NO. : 6,424,175 B1 Page 1 of 1
DATED : July 23, 2002
INVENTOR(S) : Vangal et al.

It is certified that error appears in the above-identified patent and that said Letters Patent is hereby corrected as shown below:

Title page,
Item [56], References Cited, U.S. PATENT DOCUMENTS, insert

```
-- 4,573,168    2/1986     Henze et al. ............. 375/36
   4,624,006    11/1986    Rempfer et al. .......... 377/69
   5,218,239    6/1993     Boomer .................. 307/443
   5,253,249    10/1993    Fitzgerald et al. ......... 370/24
   5,457,406    10/1995    Takada et al. ............ 326/30
   5,490,171    2/1996     Epley et al. ............. 375/257
   5,793,248    8/1998     Lee et al. ................ 327/543
   5,841,827    11/1998    Chevallier ............... 377/20
   6,037,811    3/2000     Ozguc ................... 327/108
   6,133,749    10/2000    Hansen et al. ........... 326/30
   6,188,237    2/2001     Suzuki et al. ............ 326/30 --.
```

Column 4,
Line 14, delete "16parallel" and insert -- 16 parallel --, therefor.

Signed and Sealed this

Twenty-fifth Day of March, 2003

JAMES E. ROGAN
*Director of the United States Patent and Trademark Office*